United States Patent
Chen et al.

(10) Patent No.: US 11,353,619 B2
(45) Date of Patent: Jun. 7, 2022

(54) DETERMINING SUB-SURFACE FORMATION WETTABILITY CHARACTERISTICS UTILIZING NUCLEAR MAGNETIC RESONANCE AND BULK FLUID MEASUREMENTS

(71) Applicant: Halliburton Energy Services, Inc., Houston, TX (US)

(72) Inventors: Songhua Chen, Katy, TX (US); Lilong Li, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 16/335,988

(22) PCT Filed: Apr. 11, 2018

(86) PCT No.: PCT/US2018/027165
§ 371 (c)(1),
(2) Date: Mar. 22, 2019

(87) PCT Pub. No.: WO2019/199304
PCT Pub. Date: Oct. 17, 2019

(65) Prior Publication Data
US 2021/0356619 A1 Nov. 18, 2021

(51) Int. Cl.
*G01V 3/32* (2006.01)
*G01N 24/08* (2006.01)
*G01R 33/44* (2006.01)

(52) U.S. Cl.
CPC ............. *G01V 3/32* (2013.01); *G01N 24/081* (2013.01); *G01R 33/448* (2013.01)

(58) Field of Classification Search
CPC ....... G01V 3/32; G01N 24/081; G01R 33/448
See application file for complete search history.

(56) References Cited

U.S. PATENT DOCUMENTS

| | | | |
|---|---|---|---|
| 7,888,933 B2* | 2/2011 | Minh | G01V 3/32 324/303 |
| 9,696,250 B2* | 7/2017 | Oraby | G01V 3/32 |
| 10,466,381 B2* | 11/2019 | Coman | G01R 33/448 |
| 2004/0000905 A1 | 1/2004 | Freedman et al. | |
| 2008/0204013 A1* | 8/2008 | Badry | G01N 24/081 324/303 |
| 2009/0206834 A1* | 8/2009 | Minh | G01N 24/081 324/303 |

(Continued)

*Primary Examiner* — Dixomara Vargas
(74) *Attorney, Agent, or Firm* — John W. Wustenberg; Parker Justiss, P.C.

(57) ABSTRACT

The present disclosure is directed to a method of determining wettability characteristics of a sub-surface formation within a wellbore utilizing nuclear magnetic resonance (NMR) and bulk fluid measurements at various stages of fluid saturation at that wellbore location. In another aspect, the pumping pressure is incrementally changed within the wellbore, measuring injection fluid and hydrocarbon saturation data values between the incremental pump pressure changes. In another aspect, a measuring and sampling tool is disclosed to execute the method and produce wettability characteristics. In another aspect, a system is disclosed that can operate NMR devices, bulk fluid equipment, pump systems, and other devices to collect data and to determine wettability characteristics on the collected data.

21 Claims, 9 Drawing Sheets

(56) References Cited

U.S. PATENT DOCUMENTS

| | | |
|---|---|---|
| 2010/0277165 A1 | 11/2010 | Freedman |
| 2012/0000279 A1 | 1/2012 | Daniel et al. |
| 2012/0169334 A1* | 7/2012 | Hopper ................ G01N 24/081 |
| | | 324/303 |
| 2013/0057277 A1 | 3/2013 | Zielinski et al. |
| 2013/0103319 A1* | 4/2013 | Buiting .................. G01V 11/00 |
| | | 702/12 |
| 2014/0033815 A1* | 2/2014 | Oraby ...................... G01V 3/32 |
| | | 73/152.05 |
| 2015/0346377 A1* | 12/2015 | Jebutu .................... E21B 49/00 |
| | | 324/303 |
| 2016/0305239 A1* | 10/2016 | Hopper ................ G01R 33/385 |
| 2017/0122858 A1* | 5/2017 | Li ......................... G01N 15/088 |
| 2017/0123104 A1* | 5/2017 | Donadille ................ G01V 3/06 |
| 2017/0184755 A1* | 6/2017 | Coman .................. G01R 33/50 |
| 2018/0003786 A1* | 1/2018 | Washburn ............ G01N 24/081 |
| 2019/0101665 A1* | 4/2019 | Valori ...................... G01V 3/32 |

\* cited by examiner

_DETERMINING SUB-SURFACE FORMATION WETTABILITY CHARACTERISTICS UTILIZING NUCLEAR MAGNETIC RESONANCE AND BULK FLUID MEASUREMENTS_

CROSS-REFERENCE TO RELATED APPLICATION

This application is the National Stage of, and therefore claims the benefit of, International Application No. PCT/US2018/027165 filed on Apr. 11, 2018, entitled "DETERMINING SUB-SURFACE FORMATION WETTABILITY CHARACTERISTICS UTILIZING NUCLEAR MAGNETIC RESONANCE AND BULK FLUID MEASUREMENTS." The above application is commonly assigned with this National Stage application and is incorporated herein by reference in its entirety.

BACKGROUND

In the hydrocarbon production industry, many factors are utilized by the engineers when determining an appropriate well system operation plan. These factors, if not immediately determinable, can be estimated and the well system operation plan can be continually updated as new estimations are determined. In addition, different locations within a well system can present varying factors or characteristics for which the well system operation plan needs to address.

One such factor used in developing a well system operation plan is the wettability of a sub-surface formation. This factor or characteristic can be initially estimated and then refined as new data or measurements are known. Wettability is generally the ability of a fluid to maintain contact with a solid surface and is a balance between adhesive and cohesive forces. It is a measure of a solid surface-fluid interfacial force, which describes the preference of the solid surface to contact with one or another type of fluid, which can be a liquid or gas. Wettability of a fluid on a smooth solid surface can be determined by a contact angle measurement, which is the angle, conventionally measured through the fluid, where a fluid—vapor interface meets a solid surface. For a very rugged surface, typically encountered within a wellbore, such a contact angle approach is difficult.

BRIEF DESCRIPTION

Reference is now made to the following descriptions taken in conjunction with the accompanying drawing, in which.

DETAILED DESCRIPTION

Figure 1A:
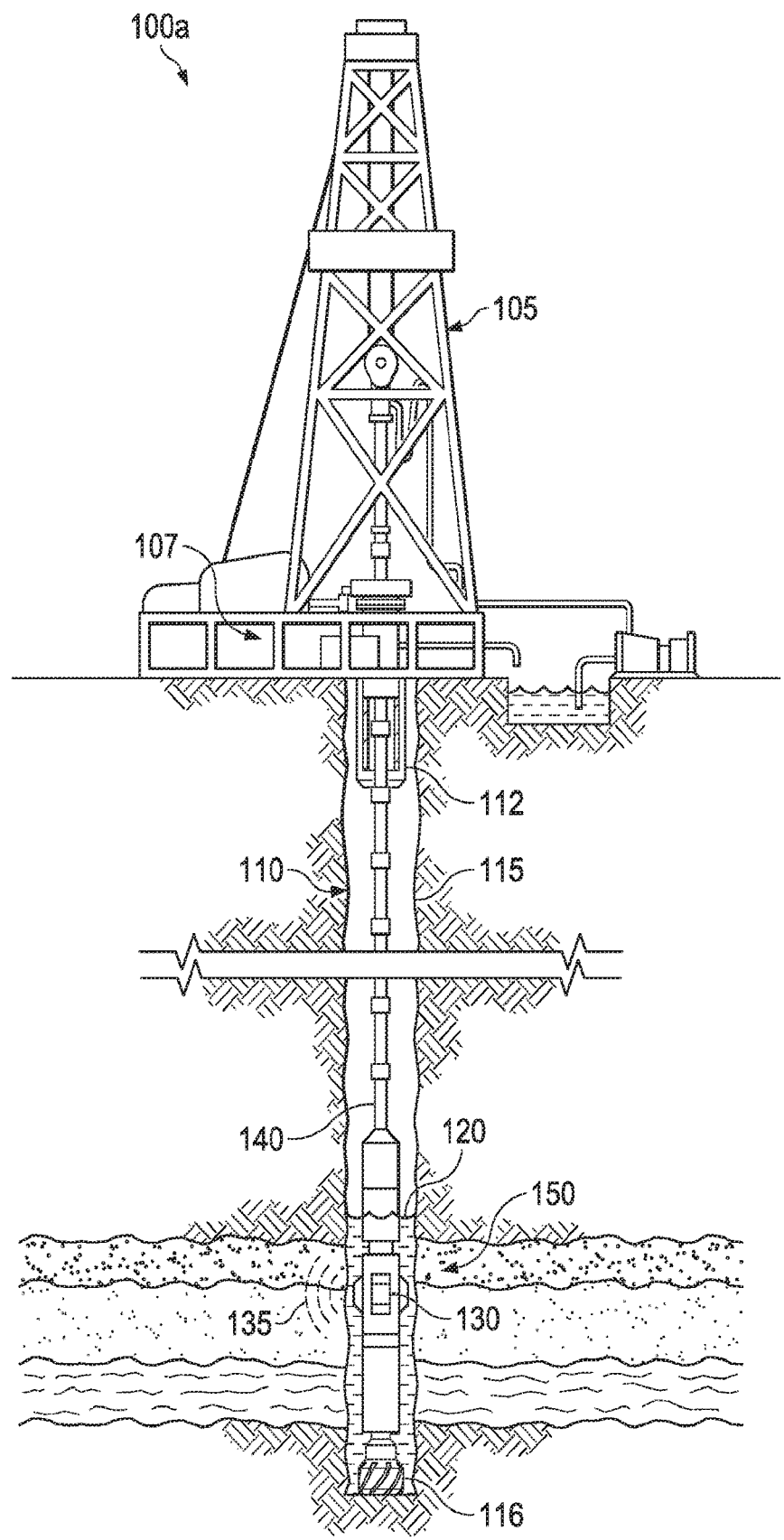
FIG. 1A illustrates a diagram of an example logging while drilling (LWD) or measurement while drilling (MWD) well system with a measuring tool inserted in the wellbore.

In the hydrocarbon production industry, reservoir recovery efficiency is strongly dependent on the known wettability characteristics of a sub-surface formation. Therefore, determining a wettability parameter, wettability type, and pore-size dependent wettability variation parameter are beneficial for estimating a rate of recovery, selecting an injection fluid, i.e., a brine or recovery fluid, selecting a well completion method, determining a type and quantity of a surfactant to be added, designing improved hydrocarbon recovery (IHR) and enhanced hydrocarbon recovery (EHR) fluids and strategies, and other well system operation planning elements.

A wettability parameter can be typically derived from executing a method to generate an index value, for example, the Amott-Harvey Index. The Amott-Harvey index, for example, has a range of −1.0 to 1.0. A wettability type is an estimation of the wettable characteristics of a sub-surface formation, for example, a formation can be strongly water (or injection fluid) wettable, strongly hydrocarbon wettable, or another combination.

A pore size wettability variation parameter is an estimation of how a fluid saturates a sub-surface formation. For example, a formation can be estimated to have small pores that are water wettable and large pores that tend to be hydrocarbon wettable, or another combination. Collectively, the wettability parameter, the wettability type, and the pore size wettability variation parameter can be referenced as the wettability characteristics of the sub-surface formation.

The disclosure describes methods for determining wettability characteristics for an in-situ location within a formation. The data used to calculate the wettability characteristics is gathered utilizing a measuring tool inserted into, for example, a wellbore and communicated, through one or more devices, to a well system engineer or operator, or well system equipment where a modification or update to a well system operation plan can be implemented. The measuring tool can be an in-situ measuring tool that measures nuclear magnetic resonance (NMR) data values and bulk fluid data values. For example, the measurement tool employed herein can include a dual-zone NMR sensor implemented on a formation testing tool.

The measuring tool, positioned within the wellbore, can include one or more components. For example, NMR equipment, bulk fluid measuring equipment, pump system capable of pumping fluids into or out of a location using varying pump pressures, and a transceiver can be included in varying combinations. The transceiver can be part of the NMR equipment. These components can be separate components, or combined into one or more components. Each component can be communicatively coupled to another component. The measuring tool can be inserted into a wellbore and moved to one or more locations within the wellbore. At each location, a series of measurements can be taken and transmitted to another device, such as located at the surface of the wellbore, where further calculations can be made, with the resulting information being communicated for further use in the well system operation plan.

The pump system of the measuring tool can be capable of increasing and decreasing the capillary pressure in small incremental steps, thereby causing the injection fluid, e.g. a brine based mud filtrate, to reach minimum and maximum saturation levels. Between the incremental steps of the pumping process, a new NMR measurement can be taken by the measuring tool.

This disclosure will use the term injection fluid to represent various types of injection, extraction, or recovery fluids, such as hydrocarbon recovery fluids, appropriate for well system extraction operations. Example injection fluids, without limitation, are water, smart water, brine, polymer based mud filtrate, IHR fluid, EHR fluid, oil based mud filtrate, synthetic based mud filtrate, pneumatic fluid, for example, air, mist, foam, and gas, and other fluid and filtrate types, including fluids containing nanotechnology, bacteria, surfactants, and other additives.

The methods, systems, and tools of this disclosure can be employed in various types of well systems including logging systems. For example, FIG. 1A demonstrates a measuring tool inserted in a wellbore of a logging while drilling (LWD) or measurement while drilling (MWD) well system. FIG. 1B demonstrates a measuring tool inserted in a wireline well system. The well systems described in FIGS. 1A and 1B can be employed for the potential production of hydrocarbons such as, without limitation, oil, natural gas, condensates, other types of hydrocarbons, or a combination thereof. FIG. 2 is an example of one type of measuring tool that can be used to take various measurements and samples of the proximate sub-surface location and surrounding fluid thereby providing the input to the algorithms for determining the wettability characteristics as described herein.

Figure 1B:
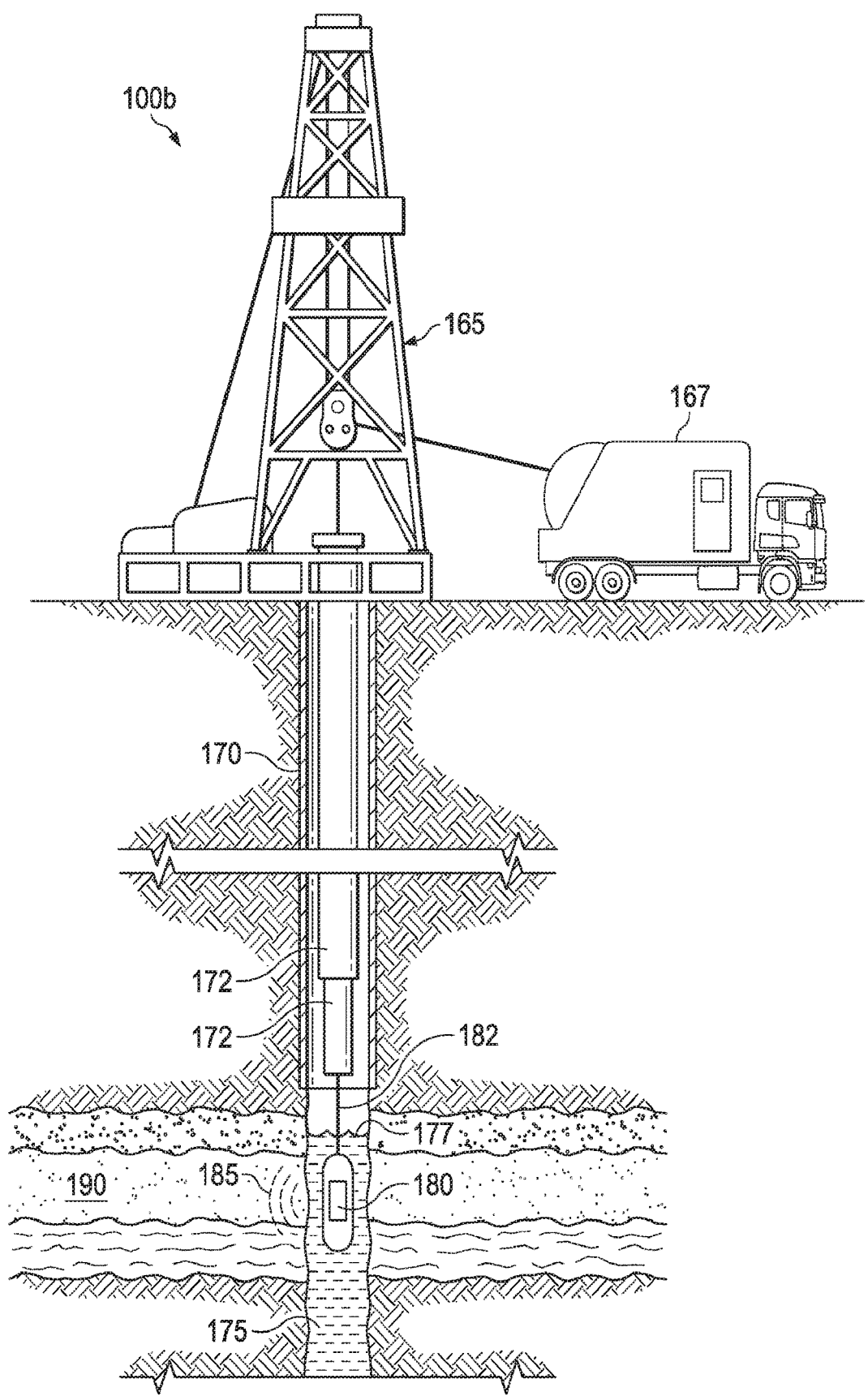
FIG. 1B illustrates a diagram of an example wireline well system with a measuring tool inserted in the wellbore.
Figure 2:
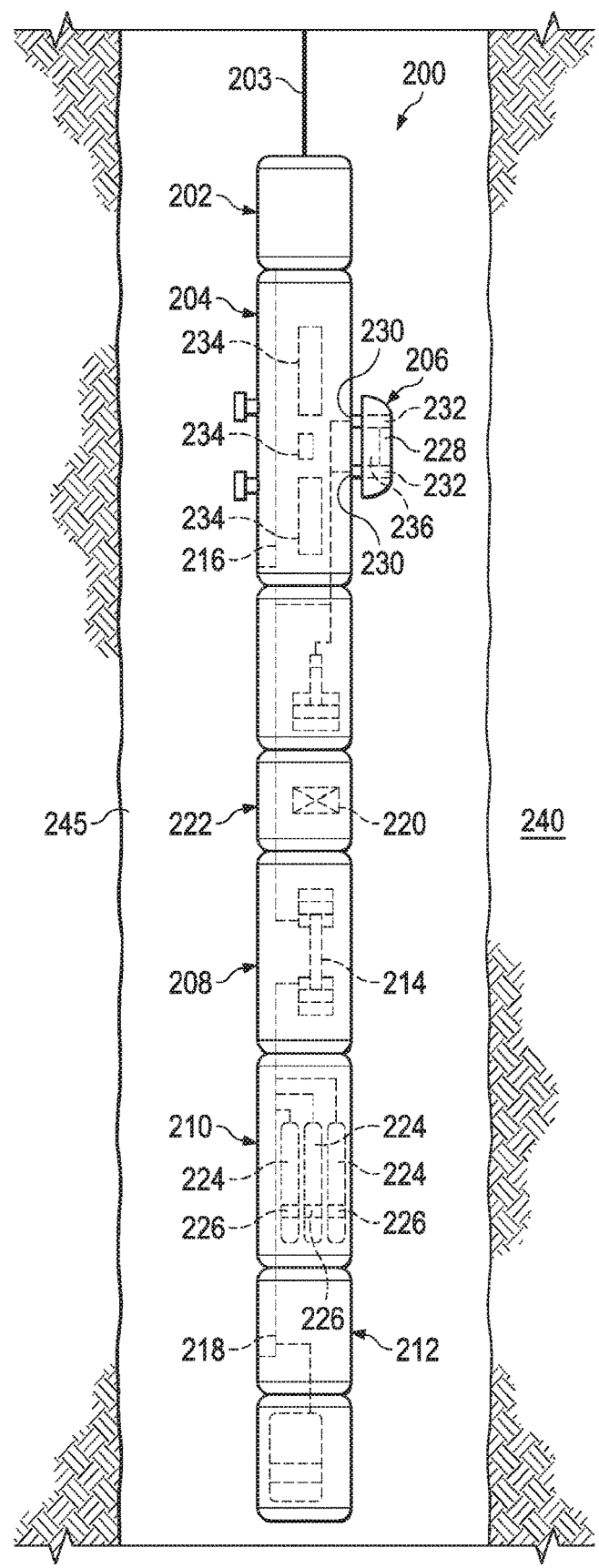
FIG. 2 illustrates a diagram of an example measuring tool.

FIG. 1A illustrates a diagram of an example LWD or MWD well system 100*a* that includes well site drilling equipment 105, well site control equipment 107, and a wellbore 110. Well site control equipment 107 is communicatively coupled to well site drilling equipment 105. Wellbore 110 includes cased section 112, and uncased section 115. Drill string 140 is inserted in the cased section 112 and uncased section 115. A drill tool 116 is connected to the drill string 140. There can be fewer or additional sections of cased and uncased types for wellbore 110; this example is demonstrating a diagram of one cased and one uncased section. The uncased section 115 contains injection fluid 120. Included with the drill string 140 is a measuring tool 130 communicatively coupled to the well site control equipment 107.

Measuring tool 130 can include a controller, NMR equipment, bulk fluid equipment, a pump system, and a transceiver. Measuring tool 130 can take NMR measurements of the surrounding sub-surface formation location under different pumping states and pumping pressures, and communicate the collected measurements to well site control equipment 107 for further action. Such further action can include, for example, determining a wettability characteristic, such as a wettability parameter, a wettability type, and a pore-size dependent wettability variation parameter, of the sub-surface formation location 150. Measuring tool's 130 communications with well site control equipment 107 can be by a variety of transmission types, for example, acoustic, wired, or wireless, utilizing one or more encoding and modulating schemes.

Measuring tool 130 can be positioned within the wellbore 110 at a location to be analyzed. Measuring tool 130 can be employed to determine the wettability characteristics of the sub-surface formation 150 according to the method or methods of operation as disclosed herein. The NMR equipment or module of the measuring tool 130 can gather data through magnetic resonance 135 of the proximate sub-surface formation 150. The measuring tool 130 can also gather data through the bulk fluid equipment for determining the wettability characteristics.

FIG. 1B illustrates a diagram of an example wireline well system 100*b* for logging and sampling of a wellbore. The wireline well system 100*b* includes well site equipment 165 communicatively coupled to well site control equipment 167 and wellbore 170 that includes cased wellbore sections 172 and uncased wellbore section 175. There can be fewer or additional wellbore sections of cased and uncased types for wellbore 170. The uncased wellbore section 175 contains injection fluid 177. A measuring tool 180 is lowered into the wellbore section 175 by wireline 182. In other embodiments, instead of a wireline, the measuring tool 180 can be lowered by another type of downhole conveyor such as a slickline or an e-line.

The measuring tool 180 can include a controller, NMR equipment, bulk fluid equipment, a pump system, and a transceiver. The measuring tool 180 can be positioned within the wellbore 170 at a location to be analyzed and execute the method or methods of operation as disclosed herein. The measuring tool 180 can employ the NMR equipment, or module, and magnetic resonance 185 to take NMR measurements of the location of the surrounding sub-surface formation 190 under different pumping states and pumping pressures via the pump system, and communicate the collected measurements to well site control equipment 167 for further action. The further actions can be, for example, determining wettability characteristics, such as a wettability parameter, a wettability type, and a pore size wettability variation parameter, of the sub-surface formation location 190. Measuring tool's 180 communications with well site control equipment 167 can be by various transmission types, for example, acoustic, wired, or wireless, utilizing one or more encoding and modulating schemes.

FIG. 2 illustrates a diagram of an example NMR logging and bulk fluid measuring tool 200 that can be used to perform the aspects described herein. The measuring tool 200 is an in-situ measuring tool capable of measuring NMR data values and bulk fluid data values. The measuring tool 200 can be inserted into various types of wellbores, such as those illustrated in FIG. 1A and FIG. 1B. For example, measuring tool 200 can be located proximate to a sub-surface location within a wellbore. Measuring tool 200 can use an NMR tool to collect NMR data values, and it can use a bulk fluid tool to collect bulk fluid data values. Measuring tool 200 can also include a controller capable of synchronizing the NMR tool and bulk fluid tool so that data values are collected substantially at the same time and under the same conditions. Measuring tool 200 can also include a processor capable of calculating wettability characteristics utilizing the collected data values from the NMR tool and the bulk fluid tool.

The measuring tool 200 is inserted into a wellbore 245 using wireline 203. Wireline 203 can, in some aspects, provide for communications to other equipment, such as surface equipment. The measuring tool 200 comprises a hydraulic power module 202 configured to convert electrical power into hydraulic power, an NMR module 204 configured to enable NMR measurements, a probe 206 configured to take samples of the formation fluids, a flow control module 208 configured to regulate the flow of various fluids in and out of the measuring tool 200, a fluid test module 222 for performing different tests on a fluid sample, a multi-chamber sample collection module 210 that can contain various size chambers for storage of the collected fluid samples, and a telemetry module 212 that provides electrical and data communication between the modules and the well site control equipment 107 and 167. The telemetry module 212 can also condition received power for use by the other modules. The arrangement of the various modules can depend on the specific application. Other aspects can include more or fewer modules than those depicted herein, depending on design and application. In particular, telemetry module 212 can provide high-speed data bus from the well site control equipment 107 and 167 of FIG. 1A and FIG. 1B to the modules or between the modules of the measuring tool 200.

In one or more aspects, the flow control module 208 includes a double acting piston pump 214, which controls the formation fluid flow from the formation into flow line 216 via the probe 206. Fluid entering the probe 206 flows through the flow line 216 and can enter the fluid testing module 222 and/or be discharged into the wellbore 245 via outlet 218. A fluid control device, such as a control valve, can be connected to flow line 216 for controlling the fluid flow from the flow line 216 into the wellbore 245. Flow line fluids can be preferably pumped either up or down with all of the flow line fluid directed into or though pump 214. Flow control module 208 can further accommodate strain-gauge pressure transducers that measure an inlet and outlet pump pressures.

The fluid testing module 222 of the tool contains a fluid testing device 220, which analyzes the fluid flowing through flow line 216. Any suitable device or devices can be utilized to analyze the fluid for a variety of parameters, such as formation pressure measurements, pressure-volume-temperature (PVT) analysis, among others. In an example aspect, a quartz gauge carrier can be used. The quartz gauge can include a pressure resonator and temperature compensation and reference crystals packaged as a single unit with each adjacent crystal in direct contact. The assembly is contained in an oil bath that is hydraulically coupled with the pressure being measured. The quartz gauge enables measurement of such parameters as the drawdown pressure of fluid being withdrawn and fluid temperature.

Sample collection module 210 of the tool can contain various size chambers 224 for storage of the collected fluid sample. In one or more aspects, one or more of the chambers 224 can include compartments separated by a valve 226, which selectively permits flow between the compartments. In one or more aspects, the probe 206 can also inject fluid from the measuring tool 200 into the formation, through which residual oil and water saturation parameters can be obtained.

The probe 206 is extendable from the measuring tool 200 via an extension mechanism 230, such as telescoping arms, scissor extensions, and the like. The probe 206 can be extended outwardly from the measuring tool 200 to contact the inner wall of the wellbore 245. The probe 206 can also include a sealing pad 228 configured to provide sealing contact with a surface of the inner wall of the wellbore 245 at a desired location. The sealing pad 228 comprises electrical and mechanical components that facilitate testing, sampling and retrieval of fluids from the formation. The probe 206 includes one or more channels 232 through which fluids from the sealed-off part of the formation surface can be collected and brought into the measuring tool 200. The sealing pad 228 can be made of an elastomeric material, such as rubber, compatible with the well fluids and the physical and chemical conditions expected to be encountered in an underground formation. In one or more aspects, the probe 206 extends from the NMR module 204.

The NMR module 204 includes one or a plurality of magnets 234 located within or on the NMR module 204. The magnets 234 can be located anywhere around or within the measuring tool 200 and separate from the probe 206. In one or more aspects, the magnets 234 are permanent magnets. The configuration of magnets 234 in the measuring tool 200 is an example configuration, designed to generate a specific magnetic field shape appropriate for a specific application. The magnets 234 can be configured in any other orientation, with different polarity orientations, sizes, shapes, and positioning. There can also be more or less magnets 234 than illustrated in measuring tool 200.

The probe 206 includes an antenna or radio frequency (RF) coil 236 configured to emit NMR signals. The coil 236 can be located on a surface of the probe 206 or embedded within the probe 206. The coil 236 can be a radial coil, a tangential coil, combinations of different coils, and other coil types. The coil 236 can include both a radial coil and a tangential coil. The probe 206 can include more than one coil 236 positioned in any position relative to each other, generating a combined RF field.

During an NMR measurement operation, the measuring tool 200 is brought into a position within the wellbore 245 approximate to a region of interest 240 in the surrounding formation. The magnets 234 are configured to induce a magnetic field in the region of interest 240. The coil 236 in the measurement device 210 is positioned to generate a RF magnetic field in the region of interest 240. In one or more aspects, the measurement device 210 can include strategically placed soft magnetic material, which is a material that is easily magnetized and demagnetized to further shape the magnetic field to the desired shape. The combined magnetic fields cause polarizing nuclear spins in the formation, which, in one or more aspects, is sensed by the RF coil 236, constituting NMR logging data. In one or more other aspects, the nuclear spins or NMR logging data are sensed by a second RF coil or antenna. In one or more aspects, the probe 206 can also include soft magnetic material which additionally shapes the static magnetic field.

In one or more aspects, the RF coil 236 can be driven by the well system control equipment 107 and 167, which can receive and/or process NMR data collected by the RF coil 236. In one or more aspects, the telemetry module 212 or another controller in the measuring tool 200 can be configured to drive the RF coil 236 and communicate the collected data uphole. In one or more aspects, the RF coil 236 can be driven at various adjustable frequencies based on the desired field and pulse scheme.

In another aspect, the measuring tool 200 can generate a magnetic field in a substantially longitudinal direction, and an RF magnetic field in a substantially transversal direction and perpendicular to the longitudinal magnetic field. The shapes of the magnetic fields are determined at least in part by the configuration of magnets 234, configuration of the coil 236, and the driving scheme of the coil 236.

Figure 3:
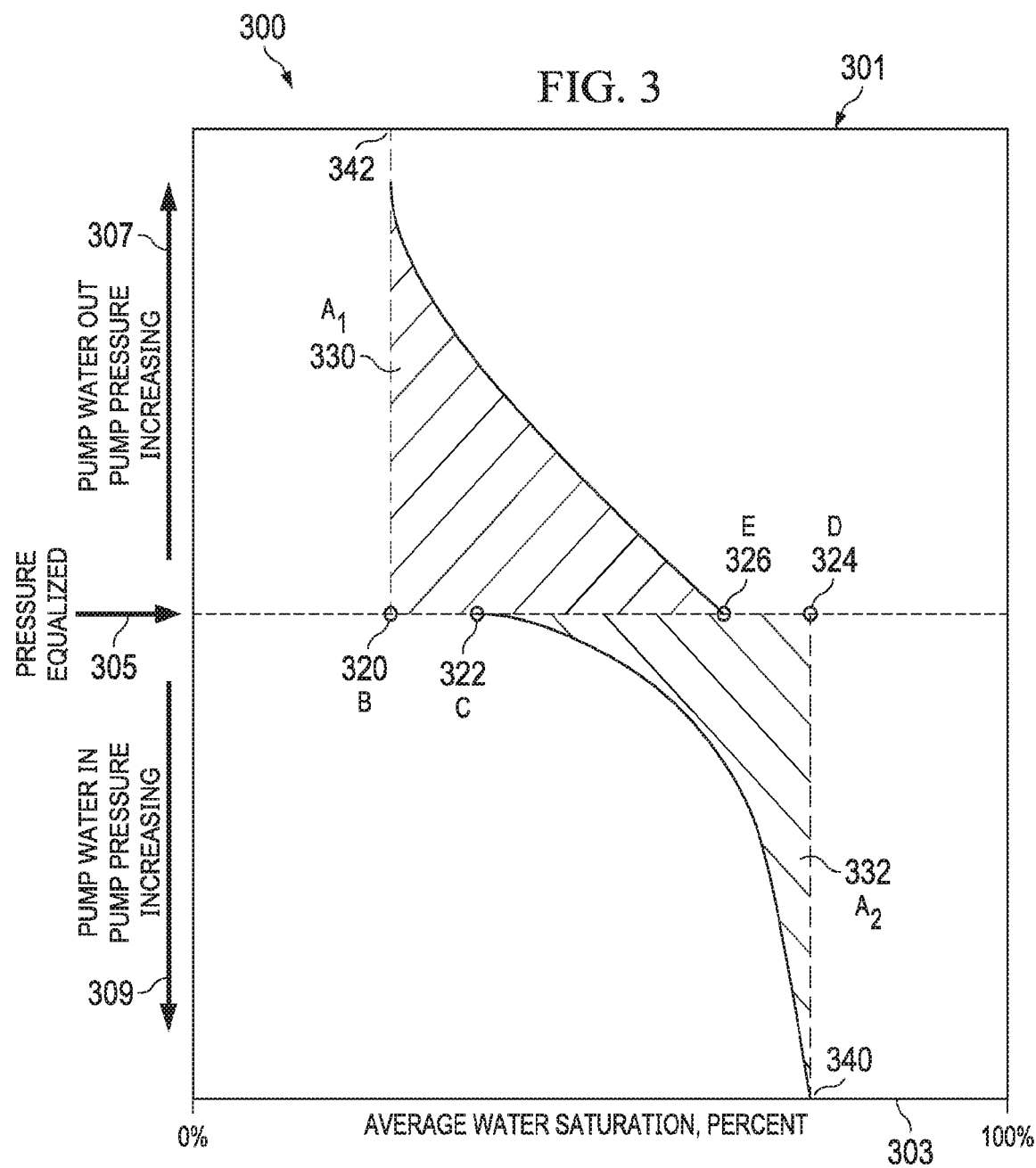
FIG. 3 illustrates a diagram of an example graph of fluid saturation at a sub-surface formation.
Figure 4:
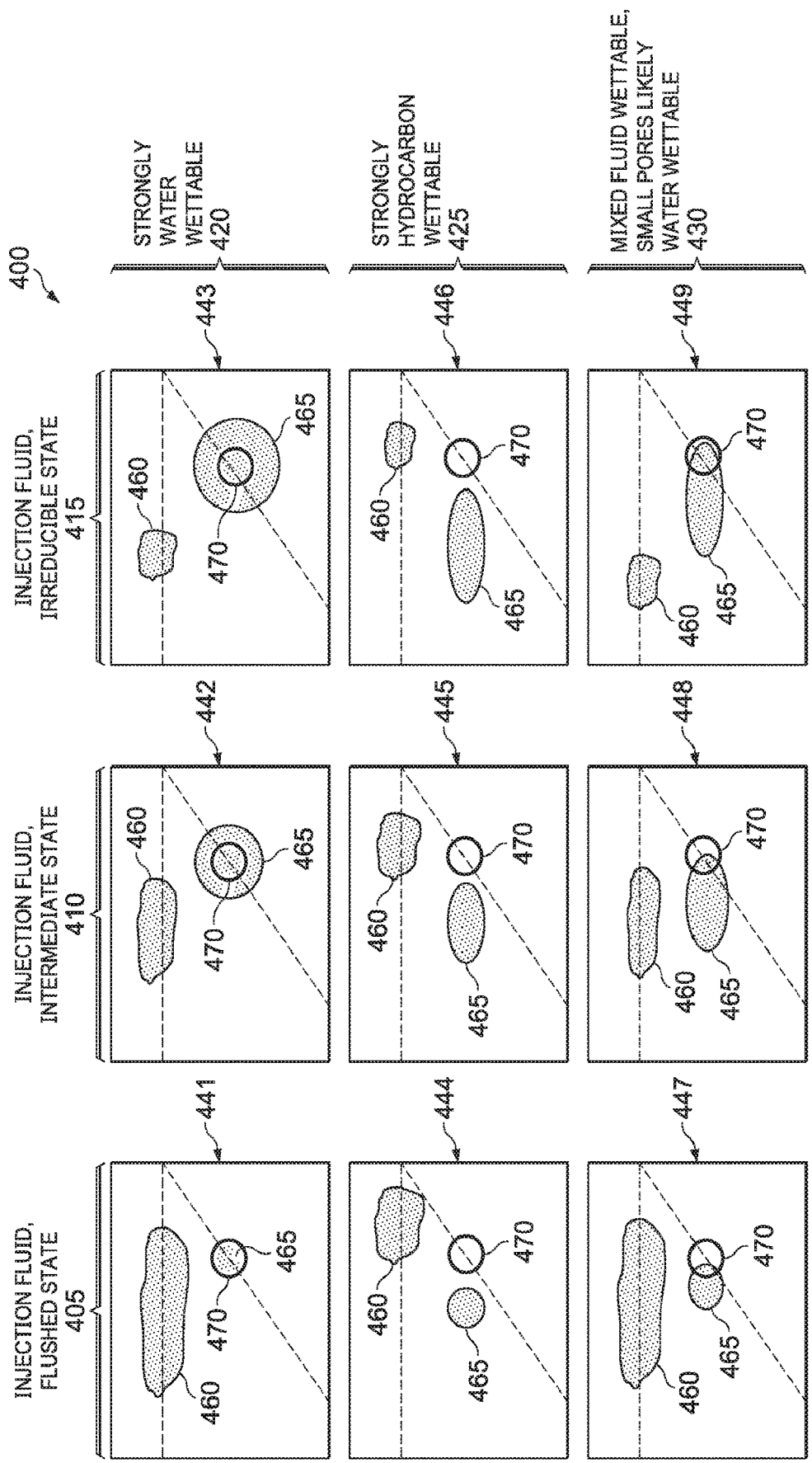
FIG. 4 illustrates a diagram of an example matrix of injection fluid and hydrocarbon measurements from in-situ and bulk fluid measurements.

A discussion on determining wettability characteristics follows that makes reference to FIG. 3 and FIG. 4. Both of these Figures will be discussed in more detail following the discussion. FIG. 3 illustrates a diagram of an example graph demonstrating injection or extraction fluid saturation levels at a sub-surface formation location and FIG. 4 illustrates an example matrix of multiple graphs of injection fluid and hydrocarbon measurements from in-situ data value and bulk fluid data value measurements. The measuring tool 200 can be used for the in-situ measurements of both the NMR data values and bulk fluid data values.

In the hydrocarbon production industry wettability characteristics are usually determined by one of two methods (1) the Amott and Harvey Index (Amott) as noted above and (2) the United States Bureau of Mines (USBM) Index. Other methods, now known or developed in the future, can be utilized. The Amott method combines two spontaneous imbibition measurements and two forced displacement measurements. The Amott method is defined as the difference of two indices:

$$AI = I_w - I_o \qquad \text{EQ. 1}$$

where the water index (or injection fluid index) ($I_w$) is defined as:

$$I_W = \frac{S_{spw} - S_{wc}}{S_{or} - S_{wc}} \qquad \text{EQ. 2}$$

and the hydrocarbon index ($I_o$) (e.g., oil) is defined as:

$$I_o = \frac{S_{or} - S_{spo}}{S_{or} - S_{wc}} \qquad \text{EQ. 3}$$

where

| | |
|---|---|
| $S_{spw}$ | is the water saturation for a zero capillary pressure (i.e. at the natural imbibition point (see FIG. 3, 322)) |
| $S_{wc}$ | is the irreducible water saturation (i.e. at the forced hydrocarbon point where further water saturation reduction is not possible (see FIG. 3, 320)) |
| $S_{or}$ | is the irreducible hydrocarbon saturation (i.e. at the forced water point where further hydrocarbon saturation reduction is not possible (see FIG. 3, 324)) |
| $S_{spo}$ | is the hydrocarbon saturation for a zero capillary pressure (i.e. at the natural imbibition point (see FIG. 3, 326)) |

The Amott method can also be represented by the formula:

$$\text{Index} = \frac{\overline{BC}}{\overline{BD}} - \frac{\overline{DE}}{\overline{DB}} \qquad \text{EQ. 4}$$

(see FIG. 3, points 320, 322, 324, and 326 for EQ. 4 line representations)

The Amott method defines the wettability parameter of a solid as:

| Wettability parameter of a solid | Index values |
|---|---|
| water wet | 0.3 to 1.0 |
| Weakly water wet | 0.0 to 0.3 |
| Weakly hydrocarbon wet | −0.3 to 0 |
| Hydrocarbon wet | −1.0 to −0.3 |

The USBM index method uses similar data as the Amott method and calculates its index parameter using the formula:

$$W = \log\frac{A1}{A2} \qquad \text{EQ. 5}$$

where

| | |
|---|---|
| A1 | is the area under the plotted curve of the average water (or injection fluid) saturation when the capillary pressure is increased to a positive pounds per square inch (PSI), meaning the water is being pumped out from the location (see FIG. 3, 330) |
| A2 | is the area under the plotted curve of the average water saturation when the capillary pressure is decreased to a negative PSI, meaning the water is being pumped into the location (see FIG. 3, 332). |

Wettability characteristics are typically determined from a core analysis. A sample of a sub-surface formation is extracted and returned to the surface of the wellbore where the sample can then be subjected to various tests. Wettability characteristics determined from core analysis methods can be time consuming and costly, for example, the time to extract a sample, return it to the surface, and conduct tests. Because of the lengthy time to conduct core analysis, it is used to assess wettability characteristics for a limited number of samples extracted from one or more exploration wells within the reservoir system.

Wettability characteristics can vary within a well reservoir system, therefore, relying on limited number of extracted samples is insufficient for maintaining a well system operation plan within a heterogeneous formation reservoir system. Moreover, the procedures for obtaining wettability characteristics from laboratory core analysis requires core clearing and re-saturation, a procedure that often results in an altering of the wettability characteristics, pore structure, and fluid phases. As a result, wettability characteristic determination by core analysis testing can be conducted under conditions substantially different from the in-situ conditions, and the exact differences in these conditions are not easily measurable.

A reservoir system production prediction utilizing the wettability characteristics calculated from a core analysis can be inconsistent to the wettability characteristics found within the formation location acquired with a downhole tool. Wettability characterization using a formation measurement performed by a downhole tool, as described herein, is more reliable and an improvement over wettability characterization calculated from core analysis measurements. Thus, it is desirable to conduct downhole wettability measurements within a formation location, using a downhole tool such as disclosed herein to provide improved wettability characteristic data to a well system operator, well system engineer, well system equipment, or other well related component so that appropriate well system operation plan decisions can be determined, for example, at a well system logging stage, or at a completion decision stage. Such improved measurement data can result in improved decisions in operating a well. The measurement data can be communicated in real time or near real time so that calculations for wettability characteristics can be made as soon as possible.

With a measuring tool, such as illustrated in FIG. 2, measurements can be taken via the NMR and the bulk fluid equipment at, or substantially at, the same location, time, pressure, and sensitive volume, i.e. the measurement zone, and at the same incremental step of the pumping process, i.e. in synchronization. The NMR can take measurements, called the in-situ data values or the in-situ saturation data values, of the sub-surface formation location. The bulk fluid equipment measures bulk fluid data values, i.e., measurements are taken on fluid proximate to the sub-surface formation location.

The NMR module can measure several types of parameters, such as the spin-lattice relaxation time ($T_1$), the spin-spin relaxation time ($T_2$), and the diffusivity. $T_1$ is also known as the longitudinal relaxation time or relaxation along the static magnetic field direction. $T_2$ is also known as the transverse relaxation time or relaxation in the plane perpendicular to the static magnetic field direction. Diffusivity is the diffusion coefficient, i.e., a diffusion constant, that is, a measure of the rate of molecular transport as a result of the random thermal movement of particles. The gathered data can be used to generate the Amott index and the USBM index of wettability characteristics.

As noted above, this disclosure presents methods to derive a wettability characteristic utilizing the above described components. In one aspect, the first measurement is taken at an injection fluid, i.e. a water-based drilling mud filtrate, flushed state, such that the hydrocarbon is at a residual hydrocarbon saturation level. The fluid in the pore space contains substantially the injection fluid. A second measurement is taken at the end of extraction of the injection fluid so that the remaining fluid (i.e., hydrocarbon) represents the minimal contamination from the injection fluid, i.e. the hydrocarbon is substantially free of the injection fluid.

A calculation can be made utilizing the measurements taken and the relative shift of the fluid saturation data values, i.e., the reservoir fluid replacing the injection fluid, can be used to determine a wettability parameter. The first measurement at the flushed state, i.e., injection fluid contaminated state, can be represented by this example formula:

$$\frac{1}{T_{2,ST\#1}} = \frac{1}{T_{2,ft}} + \rho_{ft}\frac{S}{V} \qquad \text{EQ. 6}$$

where

| | |
|---|---|
| $T_{2,ST\#1}$ | is $T_2$ at the injection fluid contaminated state (seconds) |
| $T_{2,ft}$ | is $T_2$ of the injection fluid in bulk state (seconds) |
| $\rho_{ft}$ | is the surface relaxivity of the injection fluid in the sub-surface formation (centimeters/second) |
| S | is the area of a pore surface (centimeters squared) |
| V | is the volume of that same pore (centimeters cubed) |

The second measurement at the end of the extraction of the injection fluid state, i.e., the hydrocarbon is substantially free of the injection fluid, can be represented by this example formula:

$$\frac{1}{T_{2,ST\#2}} = \frac{1}{T_{2,hc}} + \rho_{hc}\frac{S}{V} \qquad \text{EQ. 7}$$

where

| | |
|---|---|
| $T_{2,ST\#2}$ | is $T_2$ at the end of the extraction state (seconds) |
| $T_{2,hc}$ | is $T_2$ of the hydrocarbon (seconds) |
| $\rho_{hc}$ | is the surface relaxivity of the hydrocarbon in the sub-surface formation (centimeters/second) |
| S | is the area of a pore surface (centimeters squared) |
| V | is the volume of that same pore (centimeters cubed) |

Rearranging the equations results in:

$$\frac{\frac{1}{T_{2,ST\#1}} - \frac{1}{T_{2,ft}}}{\frac{1}{T_{2,ST\#2}} - \frac{1}{T_{2,hc}}} = \frac{\rho_{ft}\frac{S}{V}}{\rho_{ft}\frac{S}{V}} = \frac{\rho_{ft}}{\rho_{hc}} \qquad \text{EQ. 8}$$

In a water wet rock, as hydrocarbon displaces injection fluid, a thin film of water might remain bound to the pore surface, resulting in the hydrocarbon surface relaxivity $\rho_{hc}$ approaching zero (0.0), while the injection fluid surface relaxivity $\rho_{ft}$ is generally greater than one (1.0). When $$\frac{\rho_{ft}}{\rho_{hc}} \gg 1.0$$

(where the ratio is significantly larger than 1.0), it is indicative of strongly water-wet rock. When $$\frac{\rho_{ft}}{\rho_{hc}} \ll 1.0$$

(where the ratio is significantly smaller than 1.0), it is indicative of strongly hydrocarbon-wet rock.

The $T_1$ data can be used by itself or in combination with the $T_2$ data in calculating the wettability characteristics, as long as the data that is collected is consistent across measurements taken and consistent with the formulas used. Alternatively, diffusivity measurements can be utilized to calculate two or three dimensional (2D or 3D) NMR maps where multiple measurements can be overlaid to provide a method of modeling the various injection fluid saturation states.

In other aspects, in an oil (or other hydrocarbon) based mud drilled well, the oil (or other hydrocarbon) based mud filtrate (OBMF) is flushed into the formation location so the initial state before pressure pumping or injection is at, or substantially at, an irreducible water saturation level ($S_{wi}$). The OBMF flush is similar to the initial oil drive in the USBM method. The differential pressure between the wellbore pressure and formation location pressure balances with the capillary pressure (see FIG. 3, element 342). Then, the valve on the pumping/suction channel is opened to allow the formation location to be in contact with water (or other fluid) in the channel. A low negative pressure (i.e., extracting fluid from the formation location) is applied to mimic the free or quasi-free imbibition of water, brine, or other injection fluids, which is approximately represented in FIG. 3, elements 342→322 graph portion and by B→C of the water saturation level.

Next, the negative pressure (i.e., the extraction pressure) is increased, utilizing incremental steps, until the water (or other injection fluid) saturation level no longer increases, even with an increase in pressure. This represents the process of the brine drive in the USBM method (see FIG. 3, elements 322→340 curve portion and C→D of the water saturation level). The oil, or other hydrocarbons, are at the residual saturation level ($S_{or}$) (see FIG. 3, element 340).

Once the $S_{or}$ is reached, the water, brine, or other injection fluid, in the pumping/suction channel is replaced with oil, an oil-based drilling fluid, or other type of appropriate fluid, so that this fluid is in contact with the formation location next to the pumping channel. A low positive pressure (i.e., pumping fluid into the formation location) is utilized to mimic the free or quasi-free oil, or other hydrocarbon, imbibition in the USBM method (see FIG. 3, elements D→E).

Next, the positive pressure is increased, utilizing incremental steps, until the injection fluid again reaches the same, or substantially the same, $S_{wi}$ state. This mimics the oil, or other hydrocarbon, drive process in the USBM method (see FIG. 3, elements 326→342 curve portion and E→B of the water saturation level).

At a point during each incremental step described above, in both the positive pressure and negative pressure directions, a NMR experiment or experiments are conducted to measure oil (or other hydrocarbon) and water (brine, or other injection fluid) saturation levels at the formation location.

In a water based mud drilled well, the water based mud filtrate (WBMF) is flushed into the formation location so that the initial state before pressure pumping or injection is at, or substantially at, a residual oil, or other hydrocarbon, saturation level ($S_{or}$). The WBMF flush is similar to the initial water drive in the USBM method. The differential pressure between the wellbore pressure and formation location pressure balances with the capillary pressure (see FIG. 3, element 340). Then, the valve on the pumping/suction channel is opened to allow the formation location to be in contact with oil, or other hydrocarbons, in the channel. A low positive pressure (i.e., extracting fluid from the formation location) is applied to mimic the free or quasi-free imbibition of oil (hydrocarbon, or one of a variety of oil-wet injection fluids, such as EOR fluid, completion fluid, etc.) of the USBM method. This is approximately represented in FIG. 3 by elements 340→326 graph portion and D→E of the water saturation level.

Next, the positive pressure (i.e., the injection pressure) is increased, utilizing incremental steps, until the water (or other fluid) saturation level no longer decreases even with an increase in pump pressure. This represents the process of oil, or other hydrocarbon, drive in the USBM method (see FIG. 3, elements 326→342 curve portion and E→B of the water saturation level). At FIG. 3, element 342, water (or other fluid) is at the irreducible water saturation level ($S_{wi}$).

Once the $S_{wi}$ is reached, the oil, or other hydrocarbon, in the pumping/suction channel is replaced with an injection fluid, water-based drilling fluid, or other types of fluids, so that this fluid is in contact with the formation location next to the pumping channel. A low negative pressure (i.e., extracting fluid from the formation location) is applied to mimic the free or quasi-free water (or other fluid) imbibition of the USBM method (see FIG. 3, elements B→C).

Next, the negative pressure is increased, utilizing incremental steps, until the oil again reaches the same, or substantially the same, $S_{or}$ state. This mimics the water drive process in the USBM method (see FIG. 3 elements 322→340 portion of the curve and C→D of the water saturation level).

At a point during each incremental step described above, in both the positive pressure and negative pressure directions, a NMR experiment or experiments are conducted to measure oil (or other hydrocarbon) and water (or other injection fluid) saturation levels at the formation location.

In pumping fluid out of the sub-surface formation and pumping fluid into the sub-surface formation, the size of the incremental pump pressure steps, and therefore, the frequency of the measuring, drives the refinement of the resulting calculations. A smaller sized incremental step used for adjusting the pump pressure will result in a more refined calculation with less estimation error. The size of the incremental step utilized is related to the time available to execute the process and the equipment capability in use.

The data gathered from the measuring between the incremental steps, can be used to develop the two area graphs used by the USBM method (see FIGS. 3, 330 and 332) to determine wettability characteristics. The Amott method (see EQ. 4) can also be utilized since the graph points for EQ. 4 are known utilizing this method.

In well reservoir systems where the hydrocarbon bearing depth is above that of the hydrocarbon—injection fluid contact point, e.g., oil bearing depth above oil-water-contact (OWC), the process can continue with the assumption that the sub-surface formation is now represented by point B (see FIG. 3, 320). Injection fluid can be pumped into the sub-surface formation at a low flow rate until the injection fluid pressure equalizes with the hydrocarbon pressure. This occurs at point C (see FIG. 3, 322). Pumping pressure can be incrementally increased, with measuring occurring by the measuring tool between the incremental steps, until the point of residual, minimum, hydrocarbon saturation is reached at point D (see FIG. 3, 324). The pumping action is reversed to pump out the injection fluid until the injection fluid pressure is equalized with the hydrocarbon pressure at point E (see FIG. 3, 326). The size of the incremental step used in adjusting the pump pressure, in either pumping direction, can determine the refinement of the graph that can be generated from the data. An incremental step size can be determined that can balance the desire for refined data against the desire of completing the wettability process within an appropriate time period as provided for in the well system operation plan and the capability of the tools being utilized.

From the measurements taken at FIG. 3 points B, C, D, and, as well as the incremental measurements taken between the incremental pumping steps, the Amott index and USBM index can be calculated to determine the wettability characteristics.

In other aspects, the pore-size dependent wettability variation parameter can be determined. In an injection fluid filtrate invaded formation depth, starting at a flushed state, wherein the hydrocarbon is at a residual, minimum, saturation level, the injection fluid is pumped out of the sub-surface formation. Periodically, the measuring tool will gather the data to generate a 2D NMR response (see FIG. 4). The measuring tool can also measure the bulk fluid to determine the volume of hydrocarbon per fluid volume measured. The bulk fluid measurement is superimposed on the 2D NMR response. Pumping is stopped when neither injection fluid nor hydrocarbon saturation levels change even with increased pump pressure.

Through a comparison of the relative position and shape changes of the hydrocarbon and injection fluid measurements at the different pumping stages along with the bulk fluid measurements, a determination can be made on the general wettability type for the sub-surface formation. The 2D NMR responses can also provide a potential indication whether the large or small pores are oil-wet or water-wet or some other combination of pore size and wettability type.

In other aspects, the method can be used to determine which one of a variety of injection fluids exhibits the characteristics beneficial to the goals of the well system operation plan. One of the above mentioned method aspects, or another method, can be utilized at different locations of the same well reservoir system, where the sub-surface formation has similar properties, for example, porosity, pore size distribution, density, mineralogy, lithology, and other properties. Different injection fluids, for example, smart water, can be utilized for the locations measured. By comparing the measured data, the injection fluid, with the demonstrated characteristics desired by the well engineers or operators, can be selected along with a determined fluid injection model, for example, pump pressures and incremental step values can be determined.

FIG. 3 illustrates a diagram 300 of an example graph 301 demonstrating injection or extraction fluid saturation levels at a sub-surface formation location. Graph 301 is commonly used in the industry to show a visual data representation of the data used in Amott and USBM wettability calculations. Various devices or tools can be used to gather the data used in the graph 301, for example a NMR logging and bulk fluid measuring tool.

Graph 301 includes an x-axis 303, and y-axis components 305, 307, and 309. X-axis 303 represents the measured injection fluid saturation as a percentage of the total volume at the sub-surface formation location. It can range from 0.0% to 100.0%. The y-axis components include a pressure line 305 which represents a balance or equalized pressure between the injection fluid and a hydrocarbon. Y-axis component 307 represents the gradual increasing of pumping pressure as the injection fluid is pumped out of the location. This correlates to an increase, or positive PSI, of capillary pressure at the location. Y-axis component 309 represents the gradual increasing of pumping pressure as the injection fluid is pumped into the location. This correlates to a decrease, or negative PSI, of capillary pressure at the location.

Data plotted on graph 301 has graph points 320, 322, 324, 326, 340, and 342, and graph areas 330 and 332. Graph point 320, labeled represents the minimum injection fluid saturation data value at a time when the pump pressure increases to pump out injection fluid, and the minimum injection fluid saturation does not change. This is also known as the irreducible injection fluid saturation point. Once the pump pressure equalizes the pressure between the hydrocarbon and injection fluid, there is a natural imbibition that occurs where the location will increase injection fluid saturation until a balanced level is reached at graph point 322, labeled 'C'.

Graph point 324, labeled 'D', represents the maximum injection fluid saturation data value at a time when the pump pressure increases to pump in injection fluid, and the maximum injection fluid saturation does not change. Once the pump pressure equalizes the pressure between the hydrocarbon and injection fluid, there is a natural imbibition that occurs where the location will increase hydrocarbon saturation until a balanced level is reached at graph point 326, labeled 'E'.

Graph point 342 represents the minimum injection fluid saturation percentage for a maximum pump pressure, pumping injection fluid out of the location. Graph point 340 represents the maximum injection fluid saturation percentage for a maximum pump pressure, pumping injection fluid into the location. Graph points 342, 320, and 326, along with intermediate or incremental data points collected by the measuring tool, designate a graph area 330, labeled 'A1'. This graph area 330 represents the hydrocarbon saturation. Graph points 340, 324, 322, along with intermediate or incremental data points collected by the measuring tool, designate a graph area 332, labeled 'A2'. This graph area 332 represents the injection fluid saturation. Collectively, these various data points can be used to determine wettability characteristics.

FIG. 4 illustrates an example matrix 400 of multiple graphs 441, 442, 443, 444, 445, 446, 447, 448, 449 of injection fluid and hydrocarbon measurements from in-situ data value and bulk fluid data value measurements. The measurements can be taken from either the $T_1$ or $T_2$ data. Graphs 441, 442, 443, 444, 445, 446, 447, 448, 449 represent example measurements taken, such as by a NMR device, capable of generating a 2D response image, and a bulk fluid device. In this matrix 400, the data is translated into a visual picture showing relative saturation and spreading differences for injection fluid 460, represented as the uneven oval on the horizontal line, hydrocarbon 465, represented as an oval on or near the diagonal line, and a hydrocarbon bulk fluid response 470, represented by the circle on the diagonal line. Each graph contains a representation of injection fluid 460, hydrocarbon 465, and hydrocarbon bulk fluid response 470, though, not all representations are specifically labeled as such.

This matrix 400 includes three columns 405, 410, and 415. Additional columns can be added to represent additional incremental measurements taken. This matrix 400 also includes three rows, 420, 425, and 430. Additional rows can be added to represent a finer degree of granularity to the wettability type analysis and pore-size dependent wettability variation parameter analysis.

The first column 405 represents a measurement taken at a time when the injection fluid is at a flushed state, meaning a maximum injection fluid saturation state. The middle column 410 represents a measurement taken at an intermediate saturation state. The third column 415 represents a measurement taken at a time when the injection fluid is at an irreducible state, meaning a minimum injection fluid saturation state.

The first row 420 represents that the graphs 441, 442, and 443 demonstrate a progression of relative change indicating the location has a strong water wettability type. This can be visually seen in that graph 441 shows a large injection fluid spread and a small hydrocarbon spread, while graph 443 shows a small injection fluid saturation spread and a larger hydrocarbon saturation, with a minimum of spread.

The second row 425 represents that the graphs 444, 445, and 446 demonstrate a progression of relative change indicating the location has a strong hydrocarbon wettability type. This can be visually seen in that graph 444 has a large injection fluid saturation, with little spread, while graph 446 shows a small injection fluid saturation and spread, and the hydrocarbon saturation is large and has a large spread.

The third row 430 represents that the graphs 447, 448, and 449 demonstrate a progression of relative change indicating the location has a mixed wettability type and likely the small pores are water wet. This can be visually seen in that graph 447 has a large injection fluid spread and saturation, while graph 449 has a small injection fluid spread and a large hydrocarbon spread. This indicates that pump pressure can change the fluid saturation to a desired mixture.

Matrix 400 is an example demonstrating how the data can be utilized to determine a wettability type and a pore-size dependent wettability variation parameter. Additional graphs, including for intermediate states, can be generated. These collective graphs can then be used as a reference to compare a new measurement set and thus determine a wettability type and pore size wettability variation parameter for the new measured location. Matrix 400 is a visual representation of the data gathered. In addition, the data gathered can be represented as a data model within an electronic system that can be acted upon by other electronic processes, for example, a software program or well system equipment.

Figure 5:
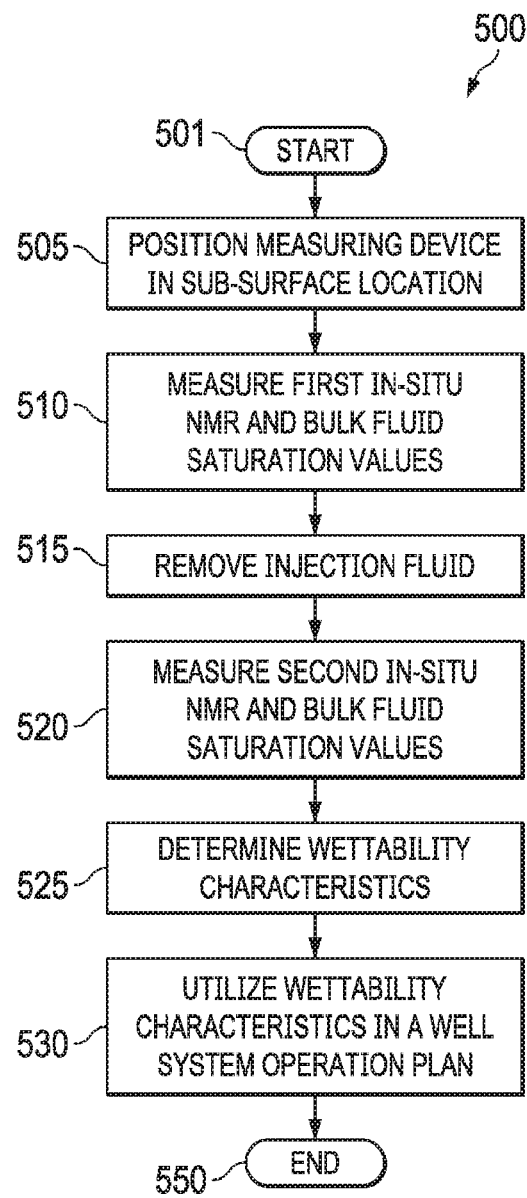
FIG. 5 illustrates a flow diagram of an example method for measuring fluid saturation in-situ.
Figure 9:
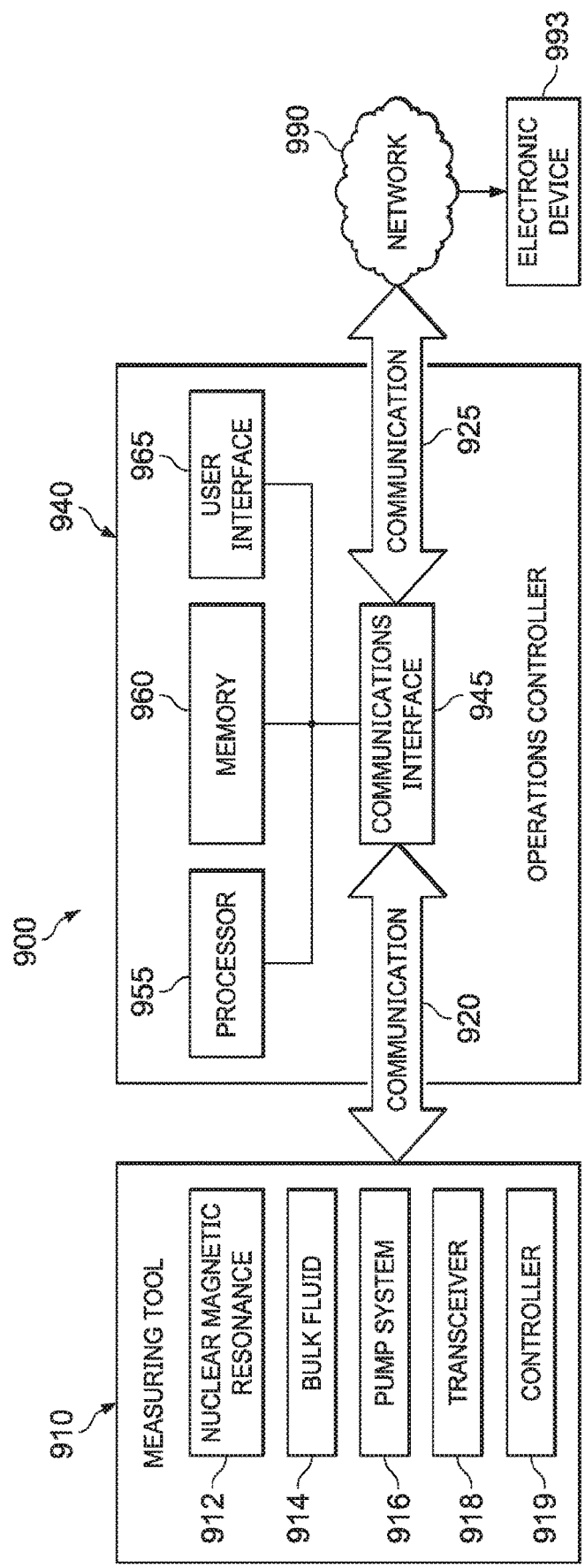
FIG. 9 illustrates a block diagram of an example sub-surface formation location wettability modeling system.

FIG. 5 illustrates a flow diagram of an example method 500 for gathering measurements of fluid saturation in-situ of a sub-surface formation location and determining a wettability parameter. The method 500 starts at a step 501 and proceeds to a step 505 where a measuring tool, for example, the measuring tool 200 in FIG. 2 and measuring tool 910 of FIG. 9, is positioned at a sub-surface formation location within a wellbore.

The method 500 proceeds to a step 510 where the first set of in-situ NMR and bulk fluid measurements are taken, at a point where the injection fluid saturation data value is at a maximum, i.e., a flushed state, where the sub-surface location is flushed with the injection fluid, meaning the injection fluid saturation level does not increase even with an increase in pump pressure. This saturation level can include some hydrocarbon saturation and it is not required that the injection fluid be at a 100.0% saturation level.

At a step 515, the injection fluid is removed to a point where the minimum injection fluid saturation level does not further change even with an increase in pump pressure. This saturation level, called the uncontaminated state, can include some injection fluid and it is not required that the injection fluid be at a 0.0% saturation level. At a step 520, a second set of in-situ NMR and bulk fluid measurements are taken. In a step 525, the measurements collected in step 510 and step 520 are used in a calculation, such as Amott and other methods, to determine wettability characteristics for the sub-surface formation location.

At a step 530, the determined wettability characteristics can be used by a well system engineer or operator, or well system equipment as input for further decision making or potential modification for a well system operation plan. The method ends at a step 550.

Figure 6:
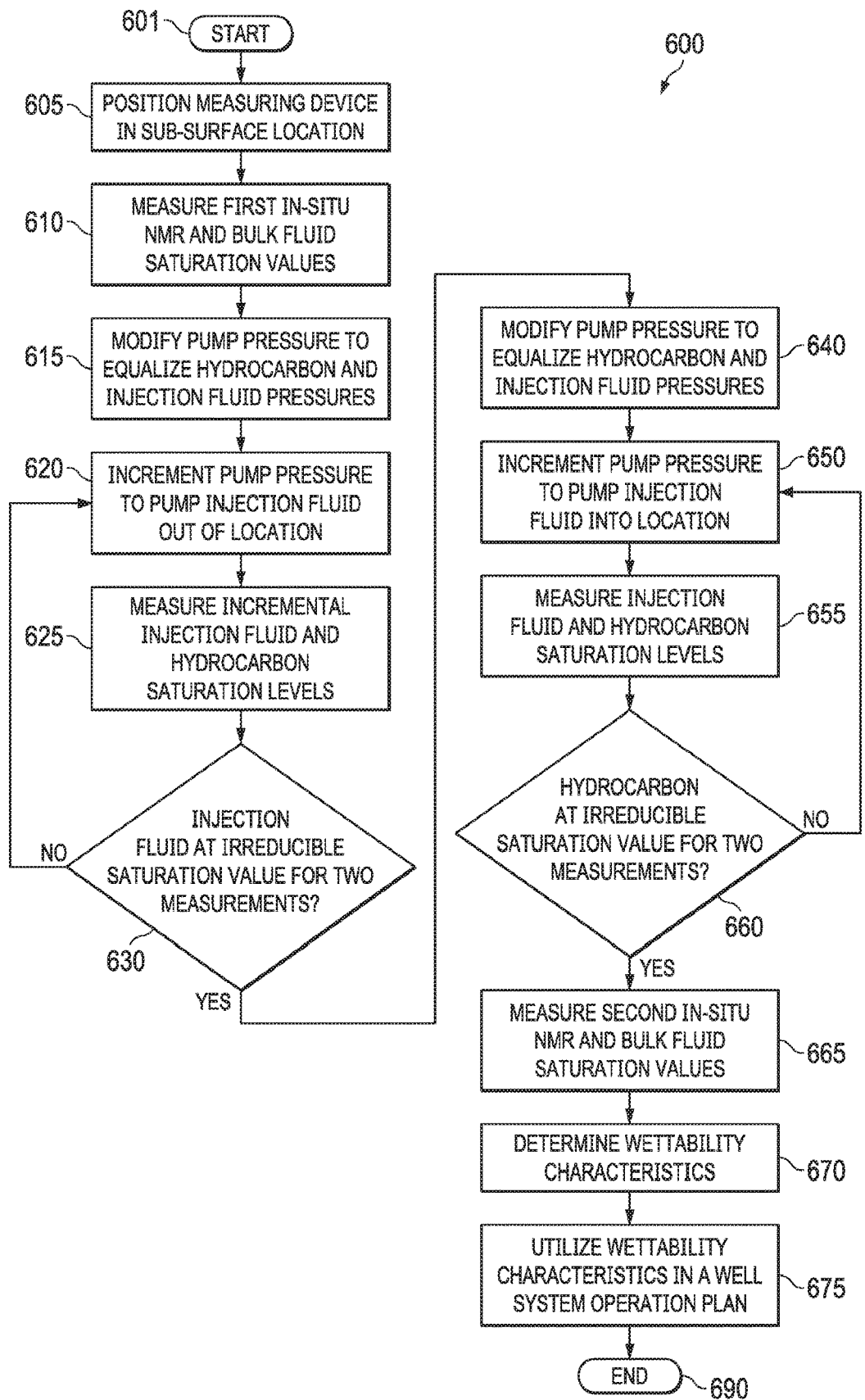
FIG. 6 illustrates a flow diagram of an example method for measuring fluid saturation utilizing incremental pump pressure changes.

FIG. 6 illustrates a flow diagram of an example method 600 for measuring in-situ fluid saturation levels utilizing incremental pump pressure changes where a measuring action is occurring between the incremental steps so that a fluid saturation model can be determined. Method 600 starts at a step 601 and proceeds to a step 605, where a measuring tool, for example, a measuring tool as demonstrated by measuring tool 200 of FIG. 2 and measuring tool 910 of FIG. 9, is positioned in a sub-surface formation location.

The method 600 proceeds to a step 610 where the first set of in-situ NMR and bulk fluid measurements are taken, at a point where the injection fluid saturation data value is at a maximum, i.e., a flushed state, where the sub-surface location is flushed with the injection fluid, meaning the injection fluid saturation level does not increase even with an increase in pump pressure. This saturation level can include some hydrocarbon saturation and it is not required that the injection fluid be at a 100.0% saturation level.

Proceeding to a step 615, the pump pressure is adjusted at a very low pressure to equalize the injection fluid and hydrocarbon pressures. At a step 620, the pump pressure is incrementally increased to pump the injection fluid out of the location. The increment pump pressure value can vary and is dependent on several factors, for example, how much time is available to complete the method execution, the equipment being used to execute the method, and how granular the data is for a determining step, such as a step 670. At a step 625, measuring in-situ NMR and bulk fluid saturation data values occurs between the incremental pump pressure changes. At a decision step 630, the method 600 determines if the measured injection fluid saturation data values do not change even after increased pump pressure is applied. If the injection fluid saturation data values do change with an increased pump pressure, then the 'No' path is followed back to step 620 and the incremental approach continues. If the injection fluid saturation data values do not change even if the pump pressure is increased, then the 'Yes' path is followed to a step 640.

Step 640 adjusts the pump pressure to a very low rate to equalize the pressure between the injection fluid and the hydrocarbon. Proceeding to a step 650, the pump pressure is incrementally increased to pump the injection fluid into the location. The increment value can vary and is dependent on several factors, for example, how much time is available to complete the method execution, the equipment being used to execute the method, and how granular the data is for a determining step, such as the step 670. At a step 655, measuring in-situ NMR and bulk fluid saturation data values occurs between the incremental changes or adjustments of the pump pressure. At a decision step 660, the method 600 determines if the measured injection fluid saturation data values do not change even after increased pump pressure is applied. If the injection fluid saturation data values do change with an increased pump pressure, then the 'No' path is followed back to step 650 and the incremental approach continues. If the injection fluid saturation data values do not change even if the pump pressure is increased, then the 'Yes' path is followed to a step 665.

In step 665, a second set of in-situ NMR and bulk fluid measurements are taken. Proceeding to a step 670, wettability characteristics, for example a wettability parameter, wettability type, and pore size wettability variation parameter, are determined from the collected measurements from steps 610, 625, 655, and 665. In a step 675, the determined wettability characteristics can be used by a well system engineer or operator, or well system equipment as input for further decision making or potential modification for a well system operation plan. The method ends at a step 690.

Figures 7, 8:
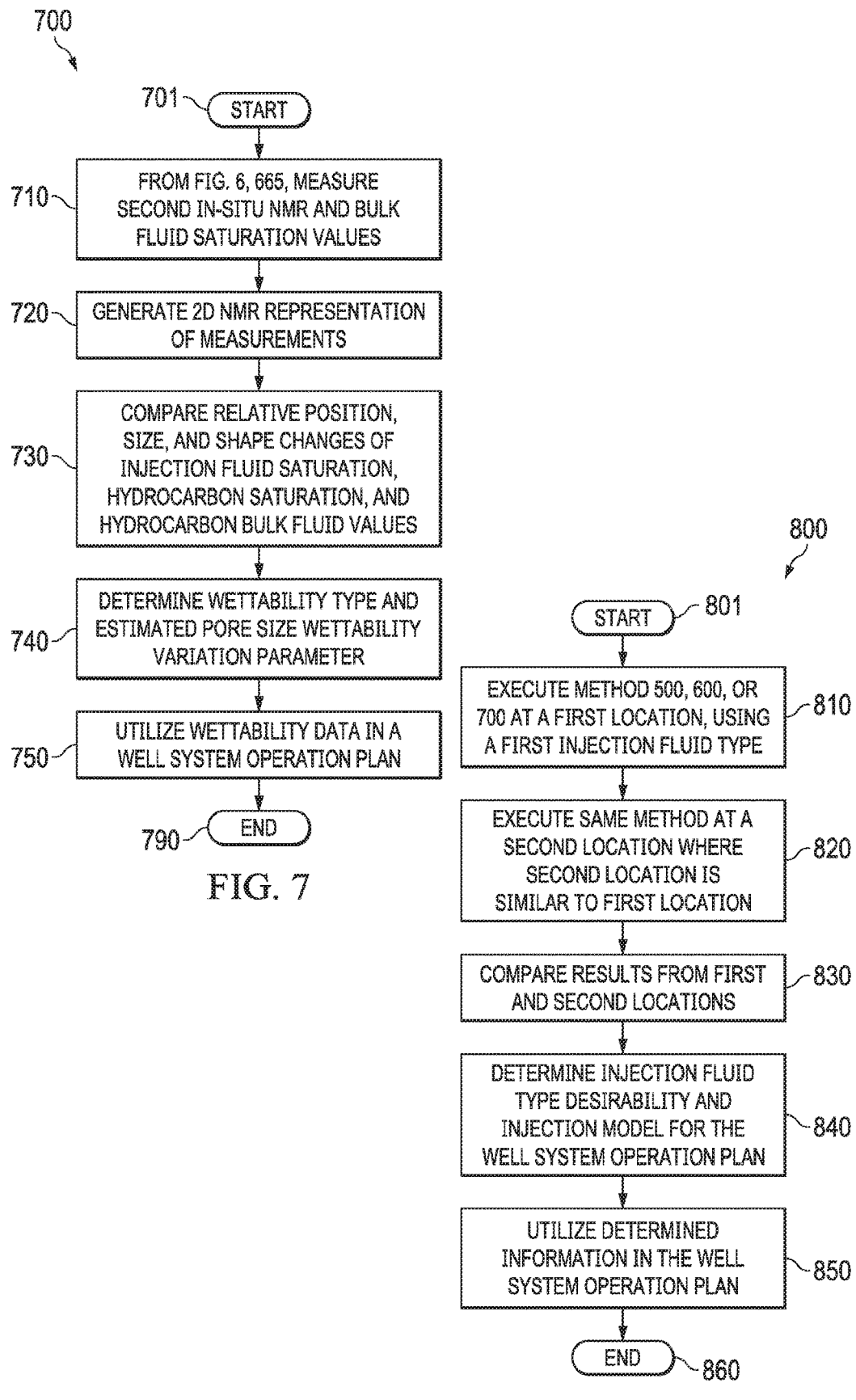
FIG. 7 illustrates a flow diagram of an example method for determining a wettability type and pore size wettability variation parameter.
FIG. 8 illustrates a flow diagram of an example method for executing methods, such as shown in FIGS. 5, 6, and 7, at multiple locations within a well reservoir system.

FIG. 7 illustrates a flow diagram of an example method 700 for measuring fluid saturation and determining a wettability type and pore-size dependent wettability variation parameter. The determining is done by comparing the change of injection fluid and hydrocarbon saturations when pump pressure is changed over time. The method 700 starts at a step 701 and proceeds to a step 710. Step 710 represents a continuation of step 665 of FIG. 6 and proceeds to a step 720.

Step 720 generates a 2D NMR representation of the collected data. This generated representation can exist as a data model within a computer system and as an output readable by a well system engineer or operator, which can be printed or displayed. This can include the measurements collected, such as the first and second in-situ NMR and bulk fluid measurements collected at steps 610 and 710, as well as the incremental measurements taken at steps 625 and 655. Matrix 400 demonstrates sample visual output generated from the collected data.

In a step 730, the relative position, shape, and size changes of the injection fluid saturation and the hydrocarbon saturation are compared across the 2D NMR representations, as well as the change in the bulk fluid measurements. In a step 740, a wettability type can be determined as well as a pore-size dependent wettability variation parameter. For example, 420, 425, 430 demonstrate example determinations made for the sample data shown in matrix 400. In a step 750, the determined wettability type and pore size wettability variation parameter can be used in the well system operation plan. Method 700 ends at a step 790.

FIG. 8 illustrates a flow diagram of an example method 800 for executing a method, such as methods 500, 600, and 700, as shown in FIGS. 5, 6, and 7 respectively, at multiple locations within a well reservoir system. Method 800 starts at a step 801 and proceeds to a step 810. At step 810, a method for measuring injection fluid saturation and hydrocarbon saturation, for example methods 500, 600, or 700, is executed at a first location within a wellbore. Proceeding to a step 820, the same method as selected in step 810 is executed at a second location within the same wellbore or at a second location within the same well reservoir system, where the first and second locations have similar mineralogical and lithological properties. The second location execution can also be executed using either a different injection fluid, and\or different injection fluid injection model, than was used at the first location.

At a step 830, the determined wettability characteristics from steps 810 and 820 are compared. At a step 840, a determination is made on the desirability of the injection fluid types, if different, and the desirability of the methods of injection of the injection fluid, if different, to be utilized for the well system operation plan. In a step 850, the well system operation plan can be modified or updated with the determined injection fluid type and injection model for the well system operation plan. At a step 860, the method ends.

FIG. 9 illustrates a block diagram of an example sub-surface formation location wettability modeling system 900. Modeling system 900 can be utilized to execute the methods described herein to determine wettability characteristics, such as wettability parameters, wettability types, and pore size wettability variation parameters. Modeling system 900 includes several components that can be combined into a single component, combined into several components in varying combinations, or the components can be separated. Modeling system 900 includes a measuring tool 910, such as measuring tool 200 described in FIG. 2, and operations controller 940.

Measuring tool 910, such as measuring tools 130, 180, and 200, is positioned at a sub-surface formation location, such as sub-surface formation locations 150, 190, and 240, commonly within a wellbore, such as wellbores 110, 170, and 245. Measuring tool 910 can include an NMR tool 912, bulk fluid equipment 914, pump system 916, transceiver 918, and a controller 919.

NMR 912 is capable of gathering data in various measurement modes, for example, $T_1$, $T_2$, and diffusivity measurement modes. The NMR 912 can include a magnet, coil(s) or antenna', an antenna interface, pulse sequence generator, a transmitter, a receiver, and a data processing computer. Bulk fluid equipment 914 is capable of measuring fluid at the sub-surface formation location. The NMR tool 912 and bulk fluid equipment 914 are capable of conducting their respective measurements at or substantially close to the same location and depth, the same time, i.e., in synchronization, and under the same sensitive volume conditions.

Pump system 916 is capable of pumping injection fluid into or out of the sub-surface formation location, and measuring tool 910 can store the injection fluid as pumped via a reservoir (not illustrated). Transceiver 918 is capable of communicating with other equipment, for example, operations controller 940. The transceiver 918 can communicate data. The controller 919 includes the necessary logic (e.g., software, hardware, or a combination thereof) to provide for the coordination of and instructions to the components 912, 914, 916, and 918. For example, the controller 919 can be configured to operate, in synchronization, the NMR tool 912 and the bulk fluid equipment 914 to collect in-situ fluid saturation data values and the bulk fluid saturation data values at a first and second injection fluid state, and generate a corresponding first and second set of data values from each of the collected data values for calculating wettability characteristics.

Measuring tool 910 is communicatively coupled with operations controller 940 through communication link 920. Communication link 920 can be of various types, for example, an acoustic transmission, a wireless transmission, or a wired transmission, and one or more data encoding and modulating schemes can be used. Some of the functionality of operations controller 940 can be performed by the measuring tool 910, such as by the controller 919. For example, as noted above the controller 919 can direct operation of the NMR tool 912 and the bulk fluid equipment 914 to obtain in-situ measurements in synchronization. The operations controller 940 can be a controller located at the surface, for example, with well system control equipment 107 and 167.

The operations controller 940 includes the necessary interfaces and logic (e.g., software, hardware, or a combination thereof) to direct at least some of the operations and equipment at a well site; at least the operations and equipment disclosed herein. The operations controller 940 includes communications interface 945, a processor 955, a memory 960, and a user interface 965. The operations controller 940 components are communicatively coupled for proper operation. Communications interface 945 provides for the communication between the operations controller 940 and communication link 920. In addition, communications interface 945 provides for communication between the operations controller 940 and communication link 925. The communications interface 945 is capable of sending instructions to the measuring tool 910 and receiving data from the measuring tool 910. The communications interface 945 can cooperate with the processor 955 to send the instructions and receive the data. In some examples, the operations controller 940 can direct operation of the NMR tool 912 and the bulk fluid equipment 914 to collect the in-situ measurements in synchronization.

Processor 955 is capable to process the received data, execute algorithms and programming, and output a result in a form requested by an operator. Processor 955 is capable of applying rules, logic, comparing against past data, and other analytical processes. The processor 955 can be configured to calculate wettability characteristics utilizing first and second set of generated data values from in-situ fluid saturation data values and bulk fluid saturation data values collected at a first and second injection fluid state by the NMR tool 912 and the bulk fluid equipment 914.

Memory 960 is capable of storing data, instructions, software programming, algorithms, results, and other information to be used by the other components of the operations controller 940. The memory 960 can be a non-transitory computer readable medium that includes algorithms that are used by the processor 955. The algorithms can correspond to at least some of the steps of the methods disclosed herein. User interface 965 is an input/output device capable of presenting to an operator or well system engineer, the data collected, intermediate processing on the data, and a result utilizing the processing. The user interface 965 can be of multiple types or formats, for example, a visual display device, such as a monitor, a 3D model generator, or other display types. The user interface 965 can also include a printer that provides a printed output. User interface 965 can be an optional component of the operations controller 940.

Communication link 925 provides for a communication link to a communications network 990, which in turn can be communicatively coupled to electronic devices 993 capable of providing to a user the data and analysis obtained by the operations controller 940 or in some examples, the controller 919. Electronic devices 993 can be various types of computing devices, for example, a laptop, a smart phone, and a computer server. The communications link 920, the communications link 925, the communications interface 945, the communications network 990, and the electronic device 993 can be conventional components or devices.

Those skilled in the art to which this application relates will appreciate that other and further additions, deletions, substitutions and modifications may be made to the described aspects. It is also to be understood that the terminology used herein is for the purpose of describing particular aspects only, and is not intended to be limiting, since the scope of the present disclosure will be limited only by the claims.

A portion of the above-described apparatuses, systems (such as the various controllers or portions thereof described herein) or methods may be embodied in or performed by various processors, such as digital data processors or computers, wherein the processors are programmed or store executable programs or sequences of software instructions to perform one or more of the steps of the methods or functions of the apparatuses or systems. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system described herein.

Certain aspects disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

Aspects disclosed herein include:

A. A method for determining wettability characteristics of a sub-surface formation employing a nuclear magnetic resonance (NMR) logging and bulk fluid measuring tool, including operating a NMR tool and bulk fluid equipment of an in-situ measuring tool to collect NMR data values and bulk fluid data values within a wellbore for the sub-surface formation, obtaining, using the in-situ measuring tool, in synchronization and in a first injection fluid state, a first set of the NMR data values and a first set of the bulk fluid data values from a first location in the wellbore in the sub-surface formation, obtaining, using said in-situ measuring tool, in synchronization and in a second injection fluid state, a second set of the NMR data values and a second set of the bulk fluid data values from a second location in the wellbore; and determining wettability characteristics for the sub-surface formation using the first sets and the second sets of data values.

B. A measuring and sampling tool for collecting in-situ nuclear magnetic resonance (NMR) data values and bulk fluid data values at a sub-surface location of a wellbore, including a NMR tool configured to measure in-situ fluid saturation data values at the sub-surface location, a bulk fluid tool configured to measure bulk fluid saturation data values at the sub-surface location, and a controller configured to operate, in synchronization, the NMR tool and the bulk fluid tool to collect the in-situ fluid saturation data values and the bulk fluid saturation data values at a first and second injection fluid state, and provide a corresponding first and second set of data values from each of the collected data values for calculating wettability characteristics.

C. A sub-surface formation wettability modeling system employing in-situ measurements, including a measuring tool operable to collect data values within a wellbore utilizing both nuclear magnetic resonance (NMR) equipment and bulk fluid equipment and a controller having a communications interface operable to send instructions to the measuring tool to collect the data values in synchronization and receive the data values from the measuring tool, and a processor operable to analyze the received data values and determine wettability characteristics, including a wettability parameter, a wettability type, and a pore size wettability variation parameter.

Each of aspects A, B, and C can have one or more of the following additional elements in combination:

Element 1: wherein the wellbore is an injection fluid based mud (IFBM) wellbore, the first injection fluid state occurs at a maximum IFBM saturation level, and the second injection fluid state occurs at a minimum IFBM saturation level. Element 2: further comprising utilizing spin-lattice relaxation time ($T_1$) for the obtaining the first set of in-situ data values and the obtaining the second set of in-situ data values. Element 3: utilizing spin-spin relaxation time ($T_2$) for the obtaining the first set of in-situ data values and the obtaining the second set of in-situ data values. Element 4: further comprising utilizing $T_1$ and $T_2$ relaxation times for the obtaining the first set of in-situ data values and the obtaining the second set of in-situ data values. Element 5: further comprising utilizing diffusivity measurements for the obtaining the first set of in-situ data values and the obtaining the second set of in-situ data values. Element 6: further comprising modifying a pump pressure of an injection fluid after obtaining the first sets of data values, wherein a pressure difference between the injection fluid and a hydrocarbon is equalized, pumping the injection fluid out of the first location and incrementally increasing a value of the pump pressure, wherein a first set of injection fluid and hydrocarbon saturation data values is generated by measuring an injection fluid saturation data value and a hydrocarbon saturation data value between the incremental pump pressure value changes, stopping the pumping injection fluid out when the injection fluid saturation data value is irreducible before and after applying the incremental pump pressure value change, modifying the pump pressure, after obtaining the second sets of data values, wherein a pressure difference between the injection fluid and the hydrocarbon is equalized, pumping the injection fluid into the first location and incrementally increasing the pump pressure value, wherein a second set of injection fluid and hydrocarbon saturation data values is generated by measuring the injection fluid saturation data value and the hydrocarbon saturation data value between the incremental pump pressure value changes, stopping the pumping injection fluid into when the hydrocarbon saturation data value is irreducible before and after applying the incremental pump pressure value change; and determining the wettability characteristics utilizing the first and second sets of the injection fluid and hydrocarbon saturation data values. Element 7: wherein the determining the wettability characteristics further comprises calculating a first area of a graph generated by the first set of injection fluid and hydrocarbon data values, calculating a second area of the graph generated by the second set of injection fluid and hydrocarbon data values, and determining a wettability index by calculating a logarithmic value of a ratio of the first area and second area. Element 8: further comprising generating the first set of injection fluid and hydrocarbon saturation data values and the second set of injection fluid and hydrocarbon saturation data values from in-situ NMR measurements and bulk fluid value measurements. Element 9: further comprising generating a two-dimensional (2D) NMR representation of the first and second sets of injection fluid and hydrocarbon saturation data values, comparing relative changes of data values within the first and second sets of injection fluid and hydrocarbon saturation data values, and a hydrocarbon bulk fluid measurement, determining a wettability type and a pore size wettability variation parameter by analyzing the comparing, and utilizing the wettability type and pore size wettability variation parameter as the wettability characteristics. Element 10: wherein a hydrocarbon bearing depth is above a hydrocarbon-injection fluid contact point. Element 11: further comprising performing the method at the first location utilizing a first injection fluid type, performing the method at the second location utilizing a second injection fluid type and, wherein the second location exhibits substantially the same mineralogical and lithological characteristics to the first location, comparing the wettability characteristics from the first location and the wettability characteristics from the second location, and determining, using the comparing, an injection model, and an injection fluid type to utilize for the wellbore. Element 12: further comprising locating the second location in a second wellbore within a same well reservoir system as the first location. Element 13: further comprising utilizing a first injection model at the first location and a second injection model at the second location where the first injection model differs from the second injection model. Element 14: wherein the NMR measuring tool uses one or more of spin-lattice relaxation time ($T_1$), spin-spin relaxation time ($T_2$), and diffusivity measurements. Element 15: further comprising a pump capable to incrementally adjust a pump pressure at the sub-surface location, for an injection fluid or a hydrocarbon and wherein the NMR tool and the bulk fluid tool are configured to collect respective saturation data values at each of the pump pressure increments. Element 16: wherein the controller is configured to direct the pump to: modify a pump pressure of an injection fluid after obtaining the first sets of data values, wherein a pressure difference between the injection fluid and a hydrocarbon is equalized, pump the injection fluid out of the first location and incrementally increase a value of the pump pressure, wherein a first set of injection fluid and hydrocarbon saturation data values is generated by measuring an injection fluid saturation data value and a hydrocarbon saturation data value between the incremental pump pressure value changes, and stop the pumping injection fluid out when the injection fluid saturation data value is irreducible before and after applying the incremental pump pressure value change. Element 17: wherein the controller is further configured to direct the pump to: modify the pump pressure, after obtaining the second sets of data values, wherein a pressure difference between the injection fluid and the hydrocarbon is equalized, pump the injection fluid into the first location and incrementally increasing the pump pressure value, wherein a second set of injection fluid and hydrocarbon saturation data values is generated by measuring the injection fluid saturation data value and the hydrocarbon saturation data value between the incremental pump pressure value changes, stop the pumping injection fluid into when the hydrocarbon saturation data value is irreducible before and after applying the incremental pump pressure value change. Element 18: wherein the data values include a first set of NMR data values and a first set of the bulk fluid data values from a first location in the wellbore in a first injection fluid state, and include a second set of NMR data values and a second set of bulk fluid data values from a second location in the wellbore in a second injection fluid state.

What is claimed is:

1. A method for determining wettability characteristics of a sub-surface formation employing a nuclear magnetic resonance (NMR) logging and bulk fluid measuring tool, comprising:

operating, within a wellbore, a NMR tool and bulk fluid equipment of an in-situ measuring tool to collect NMR data values and bulk fluid data values;

obtaining from a first location in the wellbore using the in-situ measuring tool, in synchronization and in a first injection fluid state, a first set of the NMR data values from the sub-surface formation and a first set of the bulk fluid data values from fluid proximate to the sub-surface formation;

obtaining from a second location in the wellbore using the in-situ measuring tool, in synchronization and in a second injection fluid state, a second set of the NMR data values from the sub-surface formation and a second set of the bulk fluid data values from the fluid proximate to the sub-surface formation; and determining wettability characteristics for the sub-surface formation using the first sets and the second sets of data values.

2. The method recited in claim 1, wherein the wellbore is an injection fluid based mud (IFBM) wellbore, the first injection fluid state occurs at a maximum IFBM saturation level, and the second injection fluid state occurs at a minimum IFBM saturation level.

3. The method as recited in claim 1, further comprising: utilizing spin-lattice relaxation time ($T_1$) for the obtaining the first set of in-situ data values and the obtaining the second set of in-situ data values.

4. The method as recited in claim 1, further comprising: utilizing spin-spin relaxation time ($T_2$) for the obtaining the first set of in-situ data values and the obtaining the second set of in-situ data values.

5. The method as recited in claim 1, further comprising: utilizing $T_1$ and $T_2$ relaxation times for the obtaining the first set of in-situ data values and the obtaining the second set of in-situ data values.

6. The method as recited in claim 1, further comprising: utilizing diffusivity measurements for the obtaining the first set of in-situ data values and the obtaining the second set of in-situ data values.

7. The method as recited in claim 1, further comprising: modifying a pump pressure of an injection fluid after obtaining the first sets of data values, wherein a pressure difference between the injection fluid and a hydrocarbon is equalized;

pumping the injection fluid out of the first location and incrementally increasing a value of the pump pressure, wherein a first set of injection fluid and hydrocarbon saturation data values is generated by measuring an injection fluid saturation data value and a hydrocarbon saturation data value between the incremental pump pressure value changes;

stopping the pumping injection fluid out when the injection fluid saturation data value is irreducible before and after applying the incremental pump pressure value change;

modifying the pump pressure, after obtaining the second sets of data values, wherein a pressure difference between the injection fluid and the hydrocarbon is equalized;

pumping the injection fluid into the first location and incrementally increasing the pump pressure value, wherein a second set of injection fluid and hydrocarbon saturation data values is generated by measuring the injection fluid saturation data value and the hydrocarbon saturation data value between the incremental pump pressure value changes;

stopping the pumping injection fluid into when the hydrocarbon saturation data value is irreducible before and after applying the incremental pump pressure value change; and determining the wettability characteristics utilizing the first and second sets of the injection fluid and hydrocarbon saturation data values.

8. The method as recited in claim 7, wherein the determining further comprises:
calculating a first area of a graph generated by the first set of injection fluid and hydrocarbon data values;
calculating a second area of the graph generated by the second set of injection fluid and hydrocarbon data values; and
determining a wettability index by calculating a logarithmic value of a ratio of the first area and second area.

9. The method as recited in claim 7, further comprising:
generating the first set of injection fluid and hydrocarbon saturation data values and the second set of injection fluid and hydrocarbon saturation data values from in-situ NMR measurements and bulk fluid value measurements.

10. The method as recited in claim 7, further comprising:
generating a two-dimensional (2D) NMR representation of the first and second sets of injection fluid and hydrocarbon saturation data values;
comparing relative changes of data values within the first and second sets of injection fluid and hydrocarbon saturation data values, and a hydrocarbon bulk fluid measurement;
determining a wettability type and a pore size wettability variation parameter by analyzing the comparing; and
utilizing the wettability type and pore size wettability variation parameter as the wettability characteristics.

11. The method as recited in claim 7, wherein a hydrocarbon bearing depth is above a hydrocarbon-injection fluid contact point.

12. The method as recited in claim 7, further comprising:
performing the method at the first location utilizing a first injection fluid type;
performing the method at the second location utilizing a second injection fluid type and, wherein the second location exhibits substantially the same mineralogical and lithological characteristics to the first location;
comparing the wettability characteristics from the first location and the wettability characteristics from the second location; and
determining, using the comparing, an injection model, and an injection fluid type to utilize for the wellbore.

13. The method as recited in claim 12, further comprising:
locating the second location in a second wellbore within a same well reservoir system as the first location.

14. The method as recited in claim 12, further comprising:
utilizing a first injection model at the first location and a second injection model at the second location where the first injection model differs from the second injection model.

15. A measuring and sampling tool for collecting in-situ nuclear magnetic resonance (NMR) data values and bulk fluid data values at a sub-surface location of a wellbore, comprising:
a NMR tool configured to measure in-situ fluid saturation data values at the sub-surface location;
a bulk fluid tool configured to measure bulk fluid saturation data values at the sub-surface location; and
a controller configured to operate, in synchronization, the NMR tool and the bulk fluid tool to collect the in-situ fluid saturation data values from the sub-surface formation and the bulk fluid saturation data values from fluid proximate to the sub-surface formation at a first and second injection fluid state, and provide a corresponding first and second set of data values from each of the collected data values for calculating wettability characteristics.

16. The measuring and sampling tool as recited in claim 15, wherein the NMR tool uses one or more of spin-lattice relaxation time ($T_1$), spin-spin relaxation time ($T_2$), and diffusivity measurements for measuring the in-situ fluid saturation data values.

17. The measuring and sampling tool as recited in claim 15, further comprising:
a pump capable to incrementally adjust a pump pressure at the sub-surface location, for an injection fluid or a hydrocarbon; and
wherein the NMR tool and bulk fluid tool are configured to collect respective saturation data values at each of the pump pressure increments.

18. The measuring and sampling tool as recited in claim 17, wherein the controller is configured to direct the pump to:
modify a pump pressure of an injection fluid after obtaining the first sets of data values, wherein a pressure difference between the injection fluid and a hydrocarbon is equalized,
pump the injection fluid out of the first location and incrementally increase a value of the pump pressure, wherein a first set of injection fluid and hydrocarbon saturation data values is generated by measuring an injection fluid saturation data value and a hydrocarbon saturation data value between the incremental pump pressure value changes, and
stop pumping the injection fluid out when the injection fluid saturation data value is irreducible before and after applying the incremental pump pressure value change.

19. The measuring and sampling tool as recited in claim 18, wherein the controller is further configured to direct the pump to:
modify the pump pressure, after obtaining the second sets of data values, wherein a pressure difference between the injection fluid and the hydrocarbon is equalized,
pump the injection fluid into the first location and incrementally increasing the pump pressure value, wherein a second set of injection fluid and hydrocarbon saturation data values is generated by measuring the injection fluid saturation data value and the hydrocarbon saturation data value between the incremental pump pressure value changes,
stop the pumping injection fluid into when the hydrocarbon saturation data value is irreducible before and after applying the incremental pump pressure value change.

20. A sub-surface formation wettability modeling system employing in-situ measurements, comprising:
a measuring tool operable to collect data values within a wellbore utilizing both nuclear magnetic resonance (NMR) equipment for data values from the sub-surface formation and bulk fluid equipment for data values from fluid proximate to the sub-surface formation; and
a controller including:
a communications interface operable to send instructions to the measuring tool to collect the data values in synchronization and receive the data values from the measuring tool; and
a processor operable to analyze the received data values and determine wettability characteristics, including a wettability parameter, a wettability type, and a pore size wettability variation parameter.

21. The sub-surface formation wettability modeling system as recited in claim 20 wherein the data values include a first set of NMR data values and a first set of the bulk fluid data values from a first location in the wellbore in a first injection fluid state, and include a second set of NMR data values and a second set of bulk fluid data values from a second location in the wellbore in a second injection fluid state, wherein the NMR data values are from the sub-surface formation and the bulk fluid data values are from the fluid proximate to the sub-surface formation.

* * * * *

UNITED STATES PATENT AND TRADEMARK OFFICE
CERTIFICATE OF CORRECTION

PATENT NO.      : 11,353,619 B2
APPLICATION NO. : 16/335988
DATED           : June 7, 2022
INVENTOR(S)     : Songhua Chen and Lilong Li It is certified that error appears in the above-identified patent and that said Letters Patent is hereby corrected as shown below:

In the Specification

In Column 13, Line 46, after "320" delete "labeled represents" and insert --labeled 'B', represents--

Signed and Sealed this
Thirteenth Day of September, 2022

Katherine Kelly Vidal
*Director of the United States Patent and Trademark Office*